(12) United States Patent
Imagawa

(10) Patent No.: US 9,825,159 B2
(45) Date of Patent: Nov. 21, 2017

(54) SEMICONDUCTOR DEVICE

(71) Applicant: FUJI ELECTRIC CO., LTD., Kanagawa (JP)

(72) Inventor: Tetsutaro Imagawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/390,553

(22) Filed: Dec. 26, 2016

(65) Prior Publication Data

US 2017/0236926 A1    Aug. 17, 2017

(30) Foreign Application Priority Data

Feb. 16, 2016   (JP) .................. 2016-027051

(51) Int. Cl.
  *H01L 29/66* (2006.01)
  *H01L 21/8222* (2006.01)
  *H01L 29/739* (2006.01)
  *H01L 29/73* (2006.01)

(52) U.S. Cl.
  CPC .... *H01L 29/7397* (2013.01); *H01L 29/66325* (2013.01); *H01L 29/7302* (2013.01)

(58) Field of Classification Search
  CPC .................................................. H01L 29/7397

USPC .......................................... 438/328; 257/378
See application file for complete search history.

(56) References Cited

U.S. PATENT DOCUMENTS 7,423,316 B2 *  9/2008  Kawaji ............... H01L 29/0696
                                                                257/330

FOREIGN PATENT DOCUMENTS

| JP | 2005-327806 A | 11/2005 |
| JP | 2010-135676 A | 6/2010 |
| JP | 2015-181178 A | 10/2015 |

* cited by examiner

*Primary Examiner* — Calvin Lee

(57) ABSTRACT

Provided is a semiconductor device comprising: a semiconductor substrate; a plurality of gate trench sections formed in the semiconductor substrate; and a plurality of emitter trench sections formed in the semiconductor substrate, one or more emitter trench sections provided in each region between adjacent gate trench sections of the plurality of gate trench sections, wherein the semiconductor device includes at least one of: pairs of gate trench sections in which at least two gate trench sections of the plurality of gate trench sections are connected; and a pair of emitter trench sections in which at least two emitter trench sections of the plurality of emitter trench sections are connected.

8 Claims, 9 Drawing Sheets

SEMICONDUCTOR DEVICE

The contents of the following Japanese patent application(s) are incorporated herein by reference:
NO. 2016-027051 filed in JP on Feb. 16, 2016

BACKGROUND

1. Technical Field

The present invention relates to a semiconductor device.

2. Related Art

Conventionally, a semiconductor device having a trench gate structure has been known (refer to Japanese Patent Application Publication No. 2015-181178 and Japanese Patent Application Publication No. 2005-327806, for example). Also, in the semiconductor device having the trench gate structure, forming an emitter trench section inside a gate trench section having a loop-shape structure is known (for example, Japanese Patent Application Publication No. 2010-135676).

However, a plurality of trench sections of a conventional semiconductor device are not arranged at a constant interval. The increased number of the emitter trench sections in such a structure to reduce a gate charge Qg value will lead do imbalance during switching operation.

SUMMARY

In the first aspect of the present invention, provided is a semiconductor device comprising: a semiconductor substrate; a plurality of gate trench sections formed in the semiconductor substrate; and a plurality of emitter trench sections formed in the semiconductor substrate, one or more emitter trench sections provided in each region between adjacent gate trench sections of the plurality of gate trench sections. Also, the semiconductor device may include at least one of: pairs of gate trench sections in which at least two gate trench sections of the plurality of gate trench sections are connected; and a pair of emitter trench sections in which at least two emitter trench sections of the plurality of emitter trench sections are connected.

The plurality of gate trench sections may be formed evenly in an arrangement direction of the plurality of gate trench sections.

The pairs of gate trench sections may have a loop-shape structure in which end portions of two gate trench sections of the plurality of gate trench sections are connected to one another, the pair of emitter trench sections may have a loop-shape structure in which end portions of two emitter trench sections of the plurality of emitter trench sections are connected to one another, and the pair of emitter trench sections may be formed at an inner side of the loop-shape structure of the pairs of gate trench sections in a planar view.

The pair of emitter trench sections may be formed between one pair of the pairs of gate trench sections and another pair of the pairs of gate trench sections.

The semiconductor device may further comprise a drift region of a first conductivity type formed in the semiconductor substrate, and a base region of a second conductivity type formed below the drift region in the semiconductor substrate. The drift region may be formed to contact the base region.

The semiconductor device may further comprise: emitter regions of the first conductivity type on a front surface of the semiconductor substrate, the emitter regions having a higher concentration than the drift region; and contact regions of the second conductivity type on the front surface of the semiconductor substrate, the contact regions having a higher concentration than the base region. Also, the emitter regions and the contact regions may be formed alternately in an extending direction of the gate trench sections and the emitter trench sections between the gate trench section and the emitter trench section adjacent to each other.

The semiconductor substrate may not have the emitter regions or the contact regions at an inner side of the loop-shape structure of the pair of emitter trench sections.

The semiconductor device may further comprise an interlayer insulating film at an inner side of the loop-shape structure of the pair of emitter trench sections to cover a front surface of the semiconductor substrate.

The summary clause does not necessarily describe all necessary features of the embodiments of the present invention. The present invention may also be a sub-combination of the features described above.

DESCRIPTION OF THE EMBODIMENTS

Hereinafter, the present invention will be described through embodiments of the invention. However, the following embodiments are not to limit the claimed inventions. Also, all of combinations of features described in the embodiments are not necessarily essential for means for solving the problem of the invention.

Example 1

Figure 1:
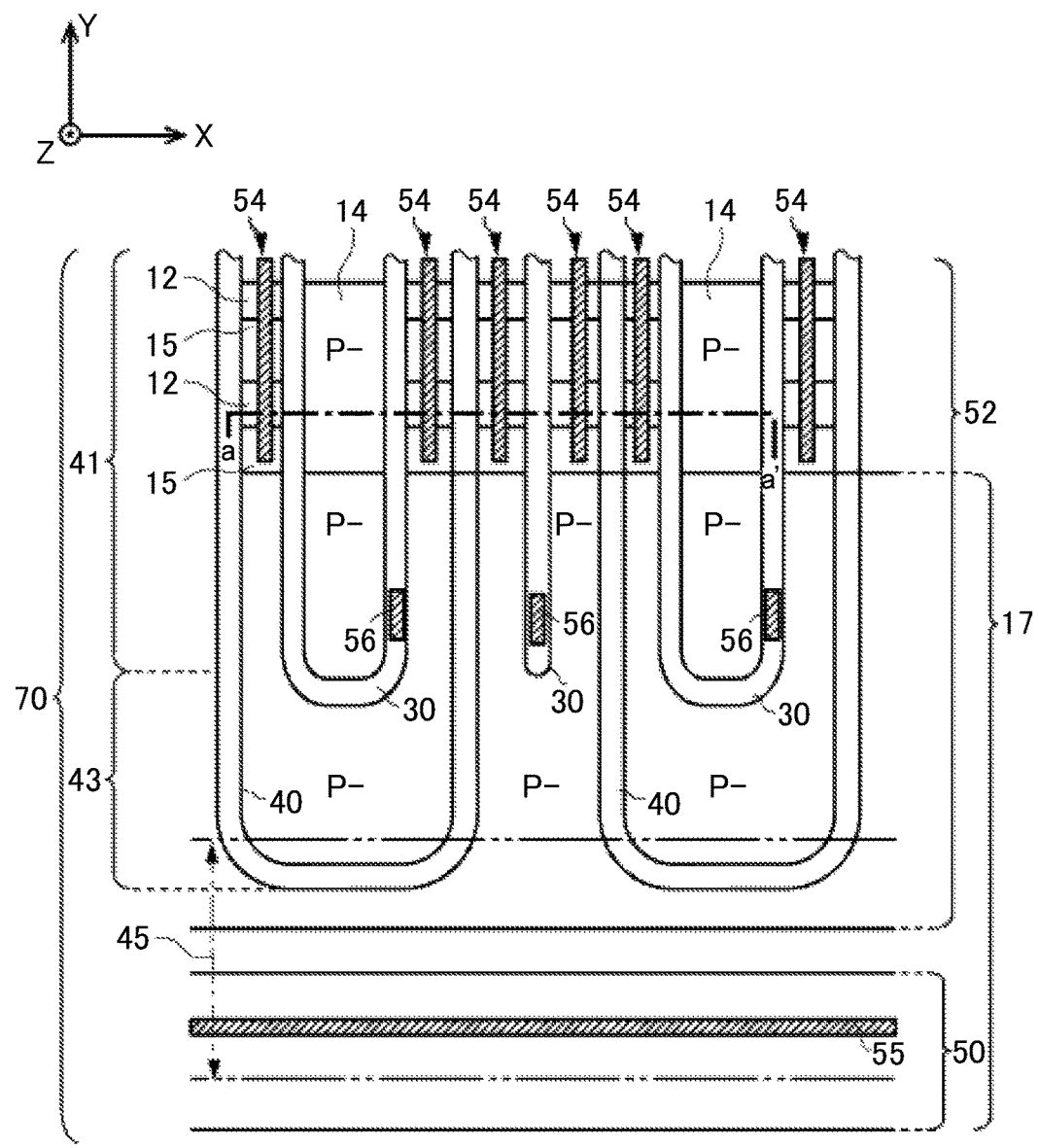
FIG. 1 illustrates an example of a plan view of a semiconductor device 100 according to Example 1.

FIG. 1 illustrates an example of a plan view of a semiconductor device 100 according to Example 1. A semiconductor device 100 of the present example is a semiconductor chip having a transistor section 70 including a transistor such as an IGBT (Insulated Gate Bipolar Transistor). Also, the semiconductor device 100 may be an RC-IGBT (Reverse Conducting-IGBT) having a diode section including a diode such as an FWD (Free Wheel Diode). In FIG. 1, a chip surface in the vicinity of an end portion of the chip is shown while other regions are omitted.

As used herein, the X direction and the Y direction are directions vertical to each other, and the Z direction is a direction vertical to the X-Y plane. The X direction, the Y direction and the Z direction form a so-called right-handed system. The semiconductor substrate of the present example has a front surface in the +Z direction and a rear surface in the −Z direction. Note that "on" and "above" mean the +Z direction. On the other hand, "under" and "below" mean the −Z direction.

Also, in FIG. 1, an active region of the semiconductor substrate of the semiconductor device 100 is illustrated and the semiconductor device 100 may include an edge termination region surrounding the active region. The active region refers to a region in which an electric current flows when the semiconductor device 100 is controlled in an ON state. The edge termination region reduces, in an example, an electric field concentration in the semiconductor substrate at the front surface side thereof. The edge termination region has, for example, a guard ring, a field plate, an RESURF (reduced surface field) and a structure of a combination thereof.

The semiconductor device 100 of the present example includes, in the chip at the front surface side thereof, a gate electrode 50, an emitter electrode 52, gate trench sections 40, emitter trench sections 30, a well region 17, emitter regions 12, base regions 14, contact regions 15 and contact holes 54, 55, 56.

Formed inside the semiconductor substrate at the front surface side thereof are gate trench sections 40, emitter trench sections 30, a well region 17, emitter regions 12, base regions 14 and contact regions 15. Formed above the front surface of the semiconductor substrate are an emitter electrode 52 and a gate electrode 50. Note that an interlayer insulating film is formed between the emitter electrode 52 and the gate electrode 50, and the front surface of the semiconductor substrate, but is omitted in FIG. 1.

The contact holes 54, 55, 56 are formed to penetrate through the interlayer insulating film formed above the semiconductor substrate. The positions in which the contact holes 54, 55, 56 are formed are not so limited to the present example.

The emitter electrode 52 is formed above the gate trench sections 40, the emitter trench sections 30, the well region 17, the emitter regions 12, the base regions 14 and the contact regions 15. The emitter electrode 52 contacts the semiconductor substrate through the contact holes 54, 56. The emitter electrode 52 is formed of a metal-containing material. In an example, at least some regions of the emitter electrode 52 are formed of aluminum. The emitter electrode 52 may include a region formed of a tungsten-containing material.

The gate electrode 50 contacts a polysilicon layer 45 through the contact hole 55. The gate electrode 50 of the present example is electrically connected to the semiconductor substrate via the polysilicon layer 45. The gate electrode 50 is formed of a metal-containing material. In an example, at least some regions of the gate electrode 50 are formed of aluminum. The gate electrode 50 may include a region formed of a tungsten-containing material. The gate electrode 50 of the present example is formed of the same material as that of the emitter electrode 52. However, the gate electrode 50 may be formed of a material different from that of the emitter electrode 52.

The emitter trench section 30 is formed to extend in a predefined extending direction on the front surface of the semiconductor substrate. One or more emitter trench sections 30 are arranged along a predetermined arrangement direction in the region in which the transistor section 70 is formed, at a predetermined interval relative to the gate trench sections 40. In the present example, the extending direction is the Y axis direction while the arrangement direction is the X axis direction.

The gate trench section 40 includes an opposing section 41 and a protruding section 43. The opposing section 41 is formed to extend in the extending direction described above through an area in which it opposes to the emitter trench section 30. That is, the opposing section 41 is formed to be parallel to the emitter trench section 30. The protruding section 43 is formed to further extend from the opposing section 41 through an area in which it does not oppose to the emitter trench section 30. In the gate trench section 40 of the present example, two opposing sections 41 which are provided at the both sides of the emitter trench section 30 respectively are connected via one protruding section 43. At least a portion of the protruding section 43 may have a curved shape.

The gate trench sections 40 and the emitter trench sections 30 of the present example are arranged alternately in the predetermined arrangement direction. Also, each trench section may be arranged at a constant interval. However, the arrangement of each trench is not limited to the example above. A plurality of gate trench sections 40 may be arranged between two emitter trench sections 30. Also, the number of gate trench sections 40 provided in each region between emitter trench sections 30 may not be constant.

The contact hole 55 is formed in the interlayer insulating film which covers the polysilicon layer 45. The contact hole 55 of the present example is formed, in a planar view, in a region which corresponds to the polysilicon layer 45 and the gate electrode 50. The position in which the contact hole 55 is formed and its shape are not so limited to the present example.

The well region 17 is formed to cover a predetermined area from an end portion of the semiconductor substrate at which the gate electrode 50 is provided. Some regions of the emitter trench section 30 and the opposing section 41 which are closer to the gate electrode 50 are formed in the well region 17. The entire protruding section 43 may be formed in the well region 17. The semiconductor substrate has a first conductivity type while the well region 17 has a second conductivity type which is different from the semiconductor substrate. In the present example, the semiconductor substrate is of N− type while the well region 17 is of P+ type. In the present example, the first conductivity type is described as N type while the second conductivity type as P type. However, the first conductivity type may be P type while the second conductivity type may be N type.

The base region 14 is formed in a region between trench sections. The base region 14 is of the second conductivity type and has a lower impurity concentration than the well region 17. The base region 14 of the present example is of P− type.

The contact region 15 on a front surface of the base region 14 is a region of the second conductivity type, having a higher impurity concentration than the base region 14. The contact region 15 of the present example is of P+ type. The emitter region 12 in the transistor section 70 is selectively formed on a portion of a front surface of the contact region 15 as a region of the first conductivity type, having a higher impurity concentration than the semiconductor substrate. The emitter region 12 of the present example is of N+ type.

The contact region 15 and the emitter region 12 are each formed in a region between one of the adjacent trench sections and the other. One or more contact regions 15 and one or more emitter regions 12 are formed alternately in the extending direction of the emitter trench section 30 and the gate trench section 40 between the emitter trench section 30 and the gate trench section 40 which are adjacent to each other.

The contact hole 54 is formed above each region of the emitter regions 12 and the contact regions 15. The contact hole 54 of the present example is formed across the emitter regions 12 and the contact regions 15. The contact hole 54 may be formed to expose the entire front surface of the emitter regions 12. However, the contact hole 54 is not formed in a region which corresponds to the base region 14 or the well region 17.

Figure 2:
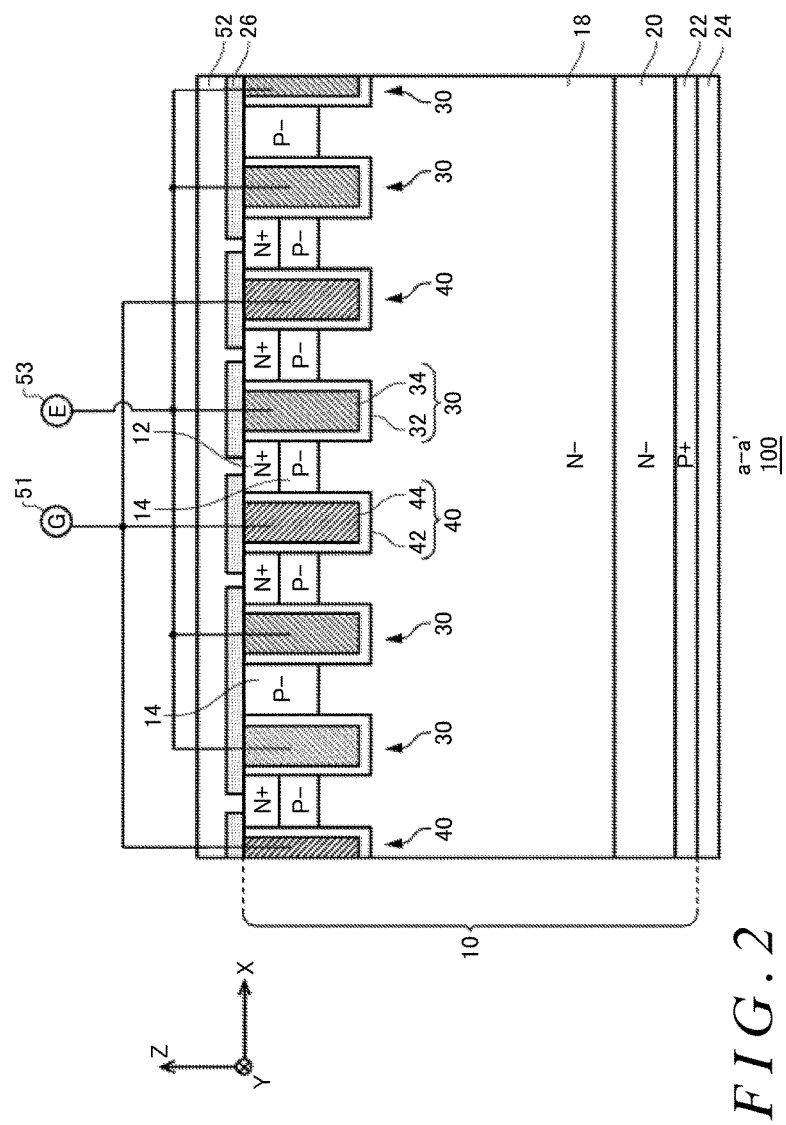
FIG. 2 illustrates an example of an a-a' cross section of the semiconductor device 100 according to Example 1.

FIG. 2 is a diagram illustrating an example of an a-a' cross section of the semiconductor device 100 according to Example 1. The semiconductor device 100 of the present example comprises, in the cross section, a semiconductor substrate 10, an emitter electrode 52 and a collector electrode 24.

The emitter electrode 52 is formed on a front surface of the semiconductor substrate 10. The emitter electrode 52 is electrically connected to an emitter terminal 53.

The collector electrode 24 is formed on a rear surface of the semiconductor substrate 10. The collector electrode 24 is electrically connected to a collector terminal. The collector electrode 24 is formed of a conductive material such as metal. As used herein, for each component such as a substrate, layer and region, a surface closer to the emitter electrode 52 is referred to as a front surface and a surface closer to the collector electrode 24 is referred to as a rear surface or a bottom section. The direction along a line connecting the emitter electrode 52 and the collector electrode 24 is referred to as a depth direction (i.e., Z axis direction).

The semiconductor substrate 10 may be a silicon substrate, and may also be a silicon carbide substrate, a nitride semiconductor substrate, or the like. The base region 14 of P− type is formed in the semiconductor substrate 10 at the front surface side thereof. Also, the emitter region 12 of N+ type is selectively formed in some regions of the base region 14 at the front surface side thereof. Also, the semiconductor substrate 10 includes a drift region 18 of N− type, a buffer region 20 of N− type and a collector region 22 of P+ type.

The drift region 18 is formed at the rear surface side of the base region 14. In particular, the drift region 18 of the present example is formed to contact the rear surface side of the base region 14. That is, an accumulating layer of the first conductivity type having a higher concentration than the drift region 18 is not formed between the base region 14 and the drift region 18.

The buffer region 20 is formed at the rear surface side of the drift region 18. An impurity concentration of the buffer region 20 is higher than an impurity concentration of the drift region 18. The buffer region 20 may serve as a field stop layer to prevent a depletion layer spreading from the rear surface side of the base region 14 from reaching the collector region 22.

The collector region 22 is formed, in the region in which the transistor section 70 is formed, at the rear surface side of the buffer region 20. Also, the collector region 22 is provided with the collector electrode 24 on the rear surface thereof.

One or more gate trench sections 40 and one or more emitter trench sections 30 are formed in the semiconductor substrate 10 at the front surface side thereof. Each trench section extends from the front surface of the semiconductor substrate 10, penetrating through the base region 14, to reach the drift region 18. In the present example, the gate trench section 40 and the emitter trench section 30 extend from the front surface of the semiconductor substrate 10, penetrating the emitter region 12 and the base region 14, to reach the drift region 18.

The gate trench section 40 is formed in the semiconductor substrate 10 at the front surface side thereof and includes an insulating film 42 and a gate conductive section 44. A pair of gate trench sections 40 forms, as illustrated in FIG. 1, a loop-shape structure by making end portions of two gate trench sections 40 of plurality of gate trench sections 40 connected to one another. As used herein, a pair of emitter trench sections 30 refers to emitter trench sections 30, forming a plurality of trench sections in the a-a' cross-sectional view of the semiconductor device 100, which are connected to one another in the planar view. Note that, as used herein, the planar view refers to a view from the front surface side to the rear surface side of the semiconductor substrate 10.

The gate conductive section 44 is formed, in the gate trench section 40, in the semiconductor substrate 10 at the front surface side. The gate conductive section 44 at least includes a region opposing to an adjacent base region 14. Each gate conductive section 44 is electrically connected to the gate terminal 51. In the present example, as shown in FIG. 1, the gate conductive section 44 electrically connects to the gate electrode 50 in the protruding section 43. Also, the gate electrode 50 electrically connects to the gate terminal 51. When a predetermined voltage is applied to the gate conductive section 44 via the gate terminal 51, a channel is formed on a surface layer on a boundary surface of the base region 14 which is in contact with the gate trench section 40. The gate conductive section 44 of the present example is formed of a conductive material such as polysilicon.

The insulating film 42 is formed to cover side surfaces and a bottom surface of the gate conductive section 44. This results in the insulating film 42 insulating the gate conductive section 44 and the semiconductor substrate 10. The insulating film 42 may be formed by oxidizing or nitriding a semiconductor of an inner wall of the gate trench.

The emitter trench section 30 includes an insulating film 32 and an emitter conductive section 34 formed in the semiconductor substrate 10 at the front surface side. Also, the emitter trench section 30 may include, as illustrated in FIG. 1, a loop-shape structure in which end portions of two emitter trench sections 30 of a plurality of emitter trench sections 30 are connected to one another. Also, a pair of emitter trench sections 30 may be formed, in the planar view, at the inner side of the loop-shape structure of the pair of gate trench sections 40. The emitter trench section 30 may include, in addition to the loop-shape structure, an I-shape structure composed of a linear shape. As used herein, the pair of emitter trench sections 30 refers to emitter trench sections 30, forming separate trench sections in the a-a' cross-sectional view of the semiconductor device 100, which are connected to one another in the planar view. For example, the pair of emitter trench sections 30 is a loop-shape structure in which both end portions of trench sections are connected or a U-shape structure in which only one end portion of trench section are connected.

The emitter conductive section 34 is formed, in the emitter trench section 30 at the front surface side of the semiconductor substrate 10. The emitter conductive section 34 may be formed of the same material as the gate conductive section 44. For example, the emitter conductive section 34 is formed of a conductive material such as polysilicon. The emitter conductive section 34 may have the same length as the gate conductive section 44 in the depth direction of the semiconductor substrate 10.

The insulating film 32 is formed to cover side surfaces and a bottom surface of the emitter conductive section 34. This results in the insulating film 32 insulating the emitter conductive section 34 and the semiconductor substrate 10. The insulating film 32 may be formed by oxidizing or nitriding a semiconductor of an inner wall of the emitter trench.

The semiconductor device 100 of the present example comprises at least one emitter trench section 30 in each region between adjacent gate trench sections 40 of a plurality of gate trench sections 40. In other words, the semiconductor device 100 does not include the gate trench sections 40 which are formed continuously in the arrangement direction without any emitter trench sections 30 positioned therebetween. This results in the semiconductor device 100 including a structure having a plurality of gate trench sections 40 each of which is positioned between the emitter trench sections 30 having a field plate effect, which can reduce electric field concentration and improve a breakdown voltage.

The semiconductor device 100 of the present example should just include at least one of: a pair of gate trench sections 40 in which at least two gate trench sections 40 of the plurality of gate trench sections 40 are connected; and a pair of emitter trench sections 30 in which at least two emitter trench sections 30 of the plurality of emitter trench sections 30 are connected. That is, at least one of the emitter trench section 30 and the gate trench section 40 should just include the loop-shape structure. For example, if the gate trench sections 40 are pairs of gate trench sections 40, the emitter trench section 30 includes the I-shape structure. However, even in this case, at least one emitter trench sections 30 is formed between adjacent gate trench sections 40.

Also, the semiconductor device 100 of the present example includes a floating region at an inner side of the emitter trench section 30 having the loop-shape structure. That is, a region at the inner side of the emitter trench section 30 having the loop-shape structure is not electrically connected to the gate electrode 50 or the emitter electrode 52. In other words, an interlayer insulating film 26 provided on the front surface of the semiconductor substrate 10 covers the front surface of the semiconductor substrate 10 at the inner side of the loop-shape structure of the pair of emitter trench sections 30. Note that the semiconductor substrate 10 of the present example does not include the emitter region 12 or the contact region 15 in the floating region at the inner side of the emitter trench section 30. This results in the electron injection facilitating effect, which can reduce a gate-on voltage.

Comparative Example 1

Figure 3:
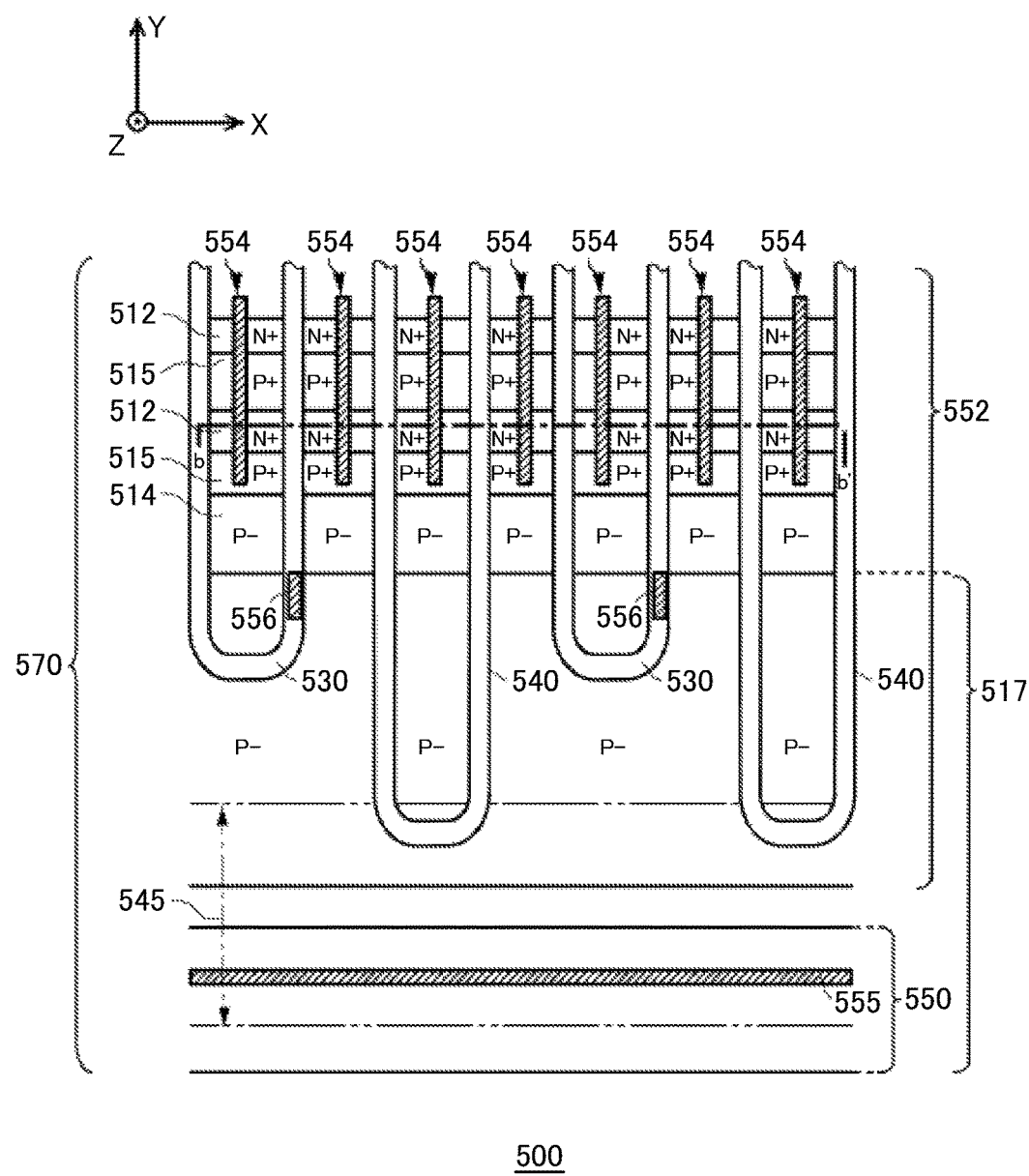
FIG. 3 illustrates an example of a plan view of a semiconductor device 500 according to Comparative Example 1.
Figure 4:
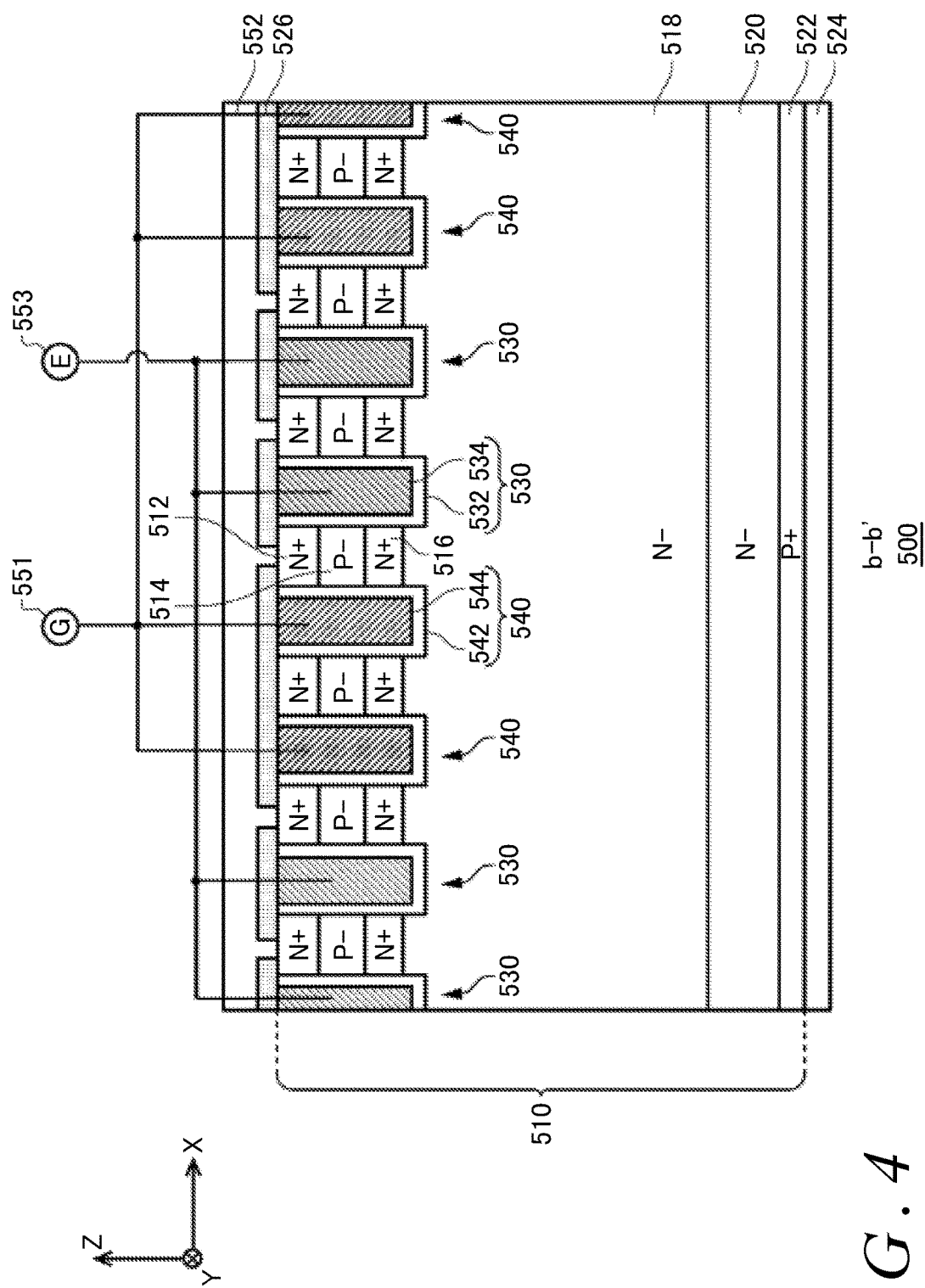
FIG. 4 illustrates an example of a b-b' cross section of the semiconductor device 500 according to Comparative Example 1.

FIG. 3 illustrates an example of a plan view of a semiconductor device 500 according to Comparative Example 1. FIG. 4 illustrates an example of a b-b' cross section of the semiconductor device 500 according to Comparative Example 1.

The semiconductor device 500 comprises a transistor section 570. The semiconductor device 500 comprises, on a front surface of a semiconductor substrate 510, an emitter region 512, a base region 514, contact regions 515, an accumulating layer 516, a well region 517, an interlayer insulating film 526, emitter trench sections 530, gate trench sections 540, a polysilicon layer 545, a gate electrode 550 and an emitter electrode 552. The emitter trench section 530 includes an insulating film 532 and an emitter conductive section 534 while the gate trench section 540 includes an insulating film 542 and a gate conductive section 544. Also, the semiconductor device 500 of the present example includes a drift region 518, a buffer region 520 and a collector region 522 formed in the semiconductor substrate 510. The collector electrode 524 is formed in the semiconductor substrate 510 at the rear surface side thereof. Note that the gate electrode 550 is connected to a gate terminal 551 and is connected to the semiconductor substrate 510 via a contact hole 555. Also, the emitter electrode 552 is connected to an emitter terminal 553 and is connected to the semiconductor substrate 510 via a contact hole 554 or a contact hole 556.

The semiconductor device 500 of the present example is different from the semiconductor device 100 according to Example 1 in the gate trench sections 540 formed continuously in the arrangement direction. Both of the emitter trench section 530 and the gate trench section 540 of the present example include the loop-shape structure. Also, the semiconductor device 500 of the present example comprises an accumulating layer 516 having a higher concentration than the drift region 518, thereby obtaining the electron injection facilitating effect.

The semiconductor device 500 of the present example comprises a pair of emitter trench sections 530 between adjacent gate trench sections 540. However, the semiconductor device 500 does not include, in the planar view, the emitter trench section 530 inside the loop-shape structure of the gate trench section 540. That is, in the cross-sectional view, a plurality of gate trench sections 540 are formed continuously. In this way, the semiconductor device 500 of the present example may be subject to decreases in a breakdown voltage due to electric field concentration in a region in which the gate trench sections 540 are formed continuously in the arrangement direction.

Comparative Example 2

Figure 5:
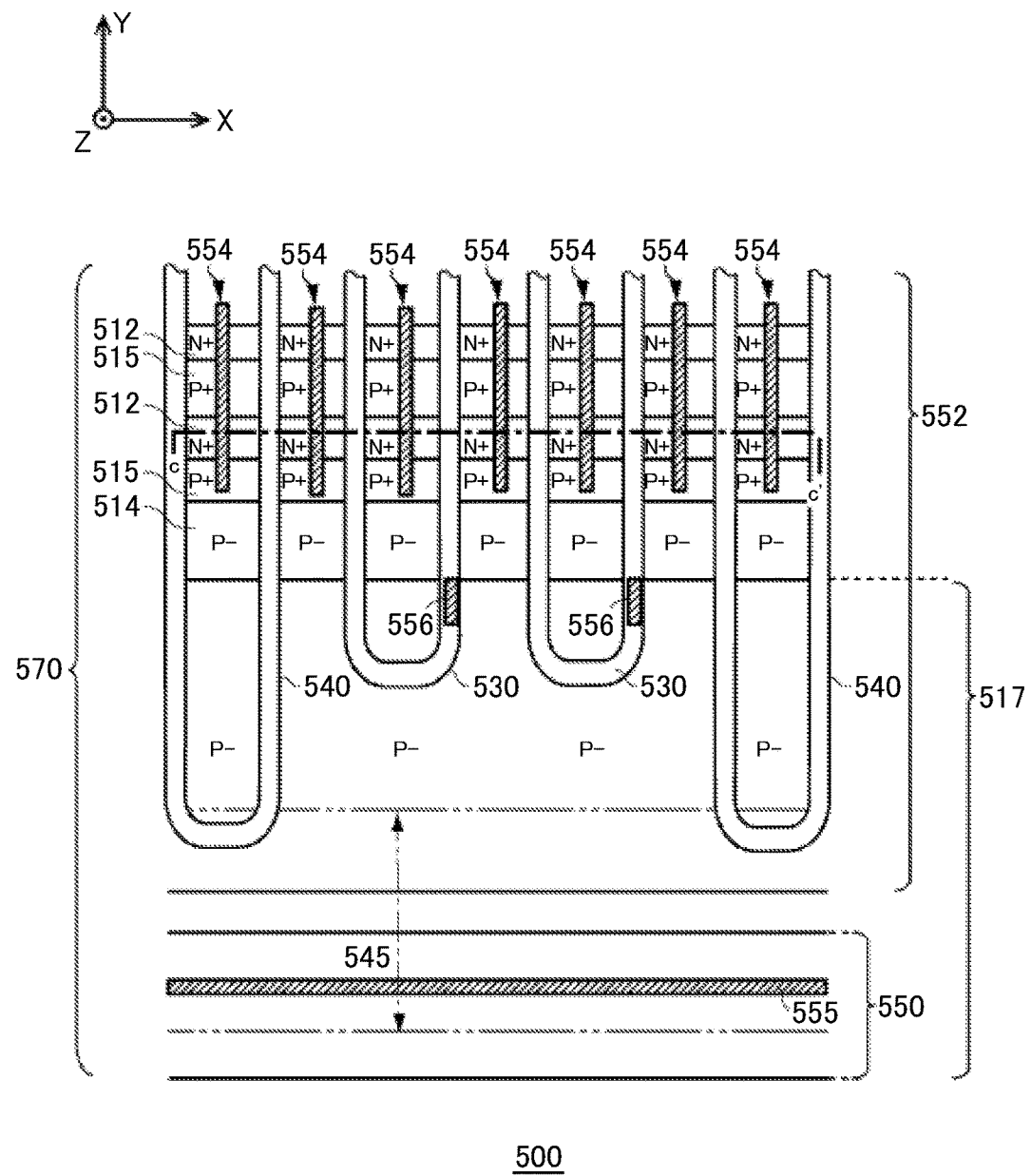
FIG. 5 illustrates an example of a plan view of a semiconductor device 500 according to Comparative Example 2.
Figure 6:
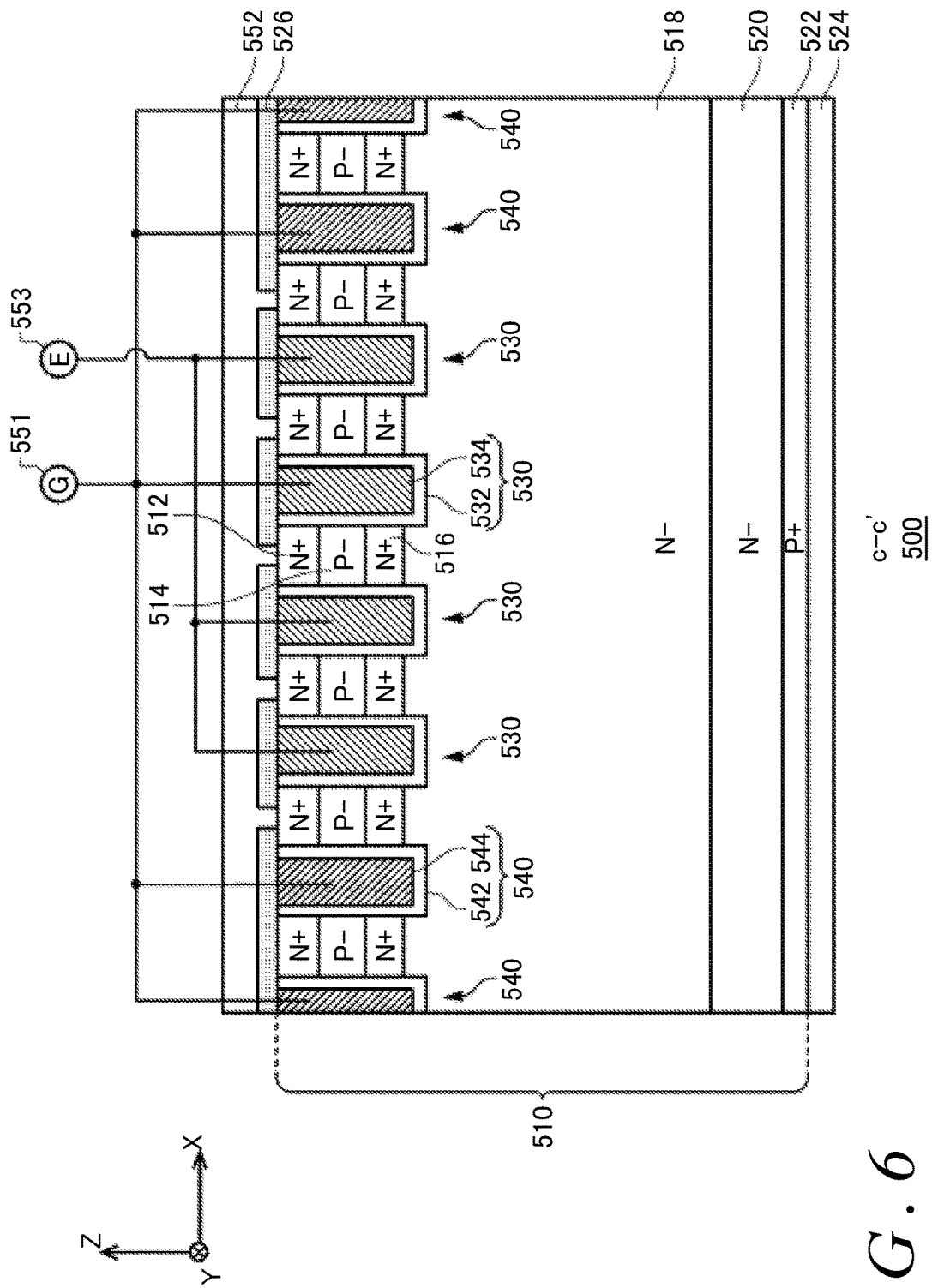
FIG. 6 illustrates an example of a c-c' cross section of the semiconductor device 500 according to Comparative Example 2.

FIG. 5 illustrates an example of a plan view of a semiconductor device 500 according to Comparative Example 2. FIG. 6 illustrates an example of a c-c' cross section of the semiconductor device 500 according to Comparative Example 2.

The semiconductor device 500 is different from the semiconductor device 100 according to Example 1 in the gate trench sections 540 formed continuously in the arrangement direction. Also, the semiconductor device 500 of the present example is different from the semiconductor device 500 according to Comparative Example 1 in four of the emitter trench sections 530 formed continuously between the continuously-formed gate trench sections 540. Note that in the present example the same labels as the labels of Comparative Example 1 represent the same configurations as those of Comparative Example 1.

The semiconductor device 500 of the present example comprises two pairs of the emitter trench sections 530 between adjacent gate trench sections 540. Meanwhile, the semiconductor device 500 does not include, in the planar view, the emitter trench section 530 inside the loop-shape structure of the gate trench section 540. That is, in the cross-sectional view, a plurality of gate trench sections 540 are formed continuously. In this way, the semiconductor device 500 of the present example may be subject to decreases in a breakdown voltage due to electric field concentration in a region in which the gate trench sections 540 are formed continuously in the arrangement direction.

Example 2

Figure 7:
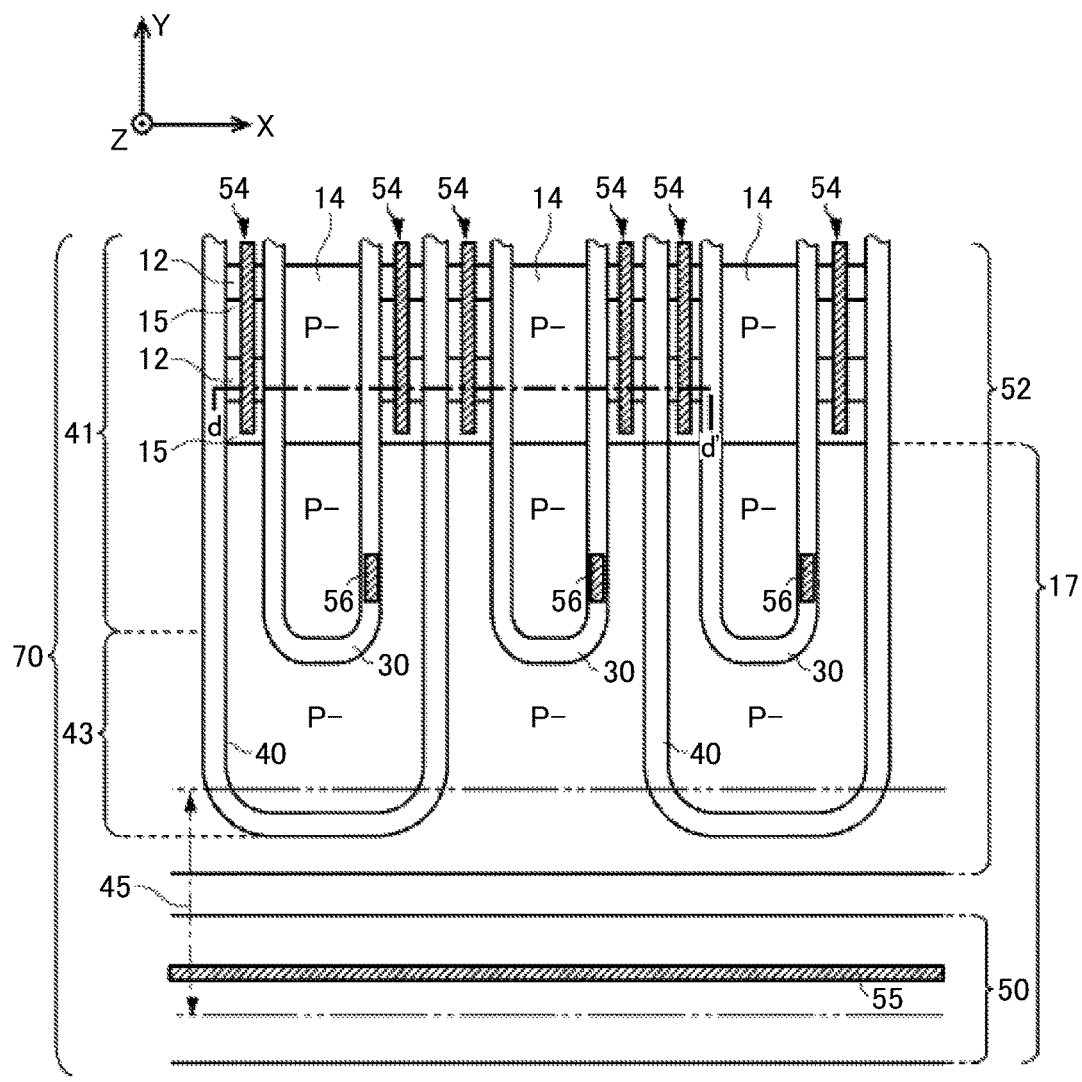
FIG. 7 illustrates an example of a plan view of a semiconductor device 100 according to Example 2.
Figure 8:
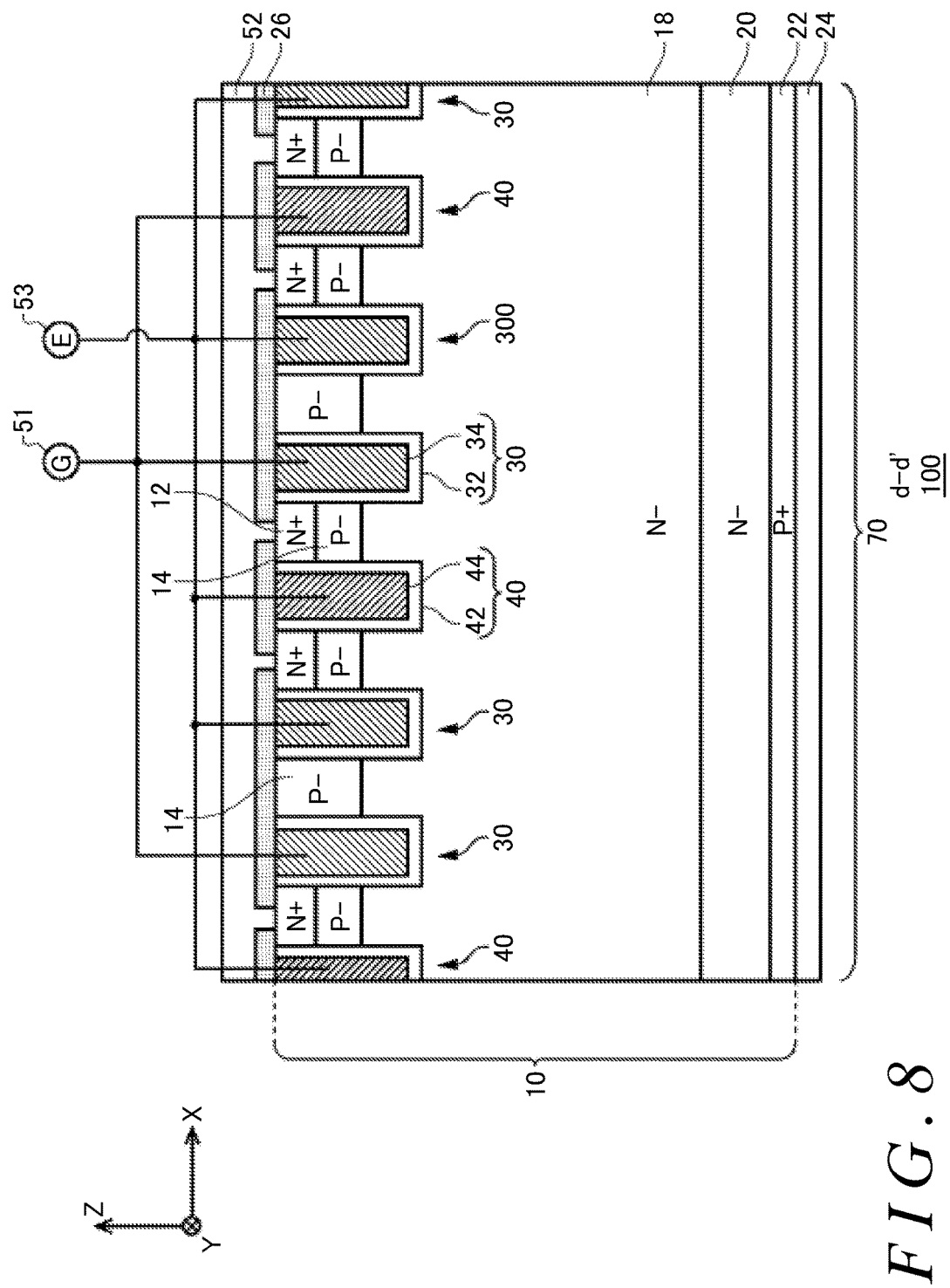
FIG. 8 illustrates an example of a d-d' cross section of the semiconductor device 100 according to Example 2.

FIG. 7 illustrates an example of a plan view of a semiconductor device 100 according to Example 2. FIG. 8 is a diagram illustrating an example of a d-d' cross section of the semiconductor device 100 according to Example 2.

The semiconductor device 100 of the present example comprises emitter trench sections 30 and gate trench sections 40 having the loop-shape structure. In the present example, a pair of emitter trench sections 30 having the loop-shape structure is formed inside the loop-shape structure of a pair of gate trench sections 40. Also, between one pair of gate trench sections 40 and another adjacent pair of gate trench sections 40, the pair of emitter trench sections 30 having the loop-shape structure is formed. Note that three or more emitter trench sections 30 may be formed between adjacent gate trench sections 40. In order to arrange gate trench sections 40 evenly, it is preferable to form the same number of emitter trench sections 30 in each region between adjacent gate trench sections 40.

The gate trench sections 40 of the present example are formed evenly in the arrangement direction of the gate trench sections 40. That is, the gate trench sections 40 are at the same interval in the X axis direction. The gate trench sections 40 of the semiconductor device 100 are formed evenly, which can eliminate imbalance due to gate signals during switching operation.

Note that the semiconductor device 100 of the present example includes a floating region at the inner side of the pair of emitter trench sections 30. With the floating region, the electron injection facilitating effect is obtained. This results in the semiconductor device 100 of the present example obtaining the electron injection facilitating effect even without the accumulating layer 516, unlike the semiconductor device 500 according to Comparative Examples 1 and 2. Also, the accumulating layer 516 needs not to be formed, which can reduce manufacturing cost relative to the semiconductor device 500.

Figure 9:
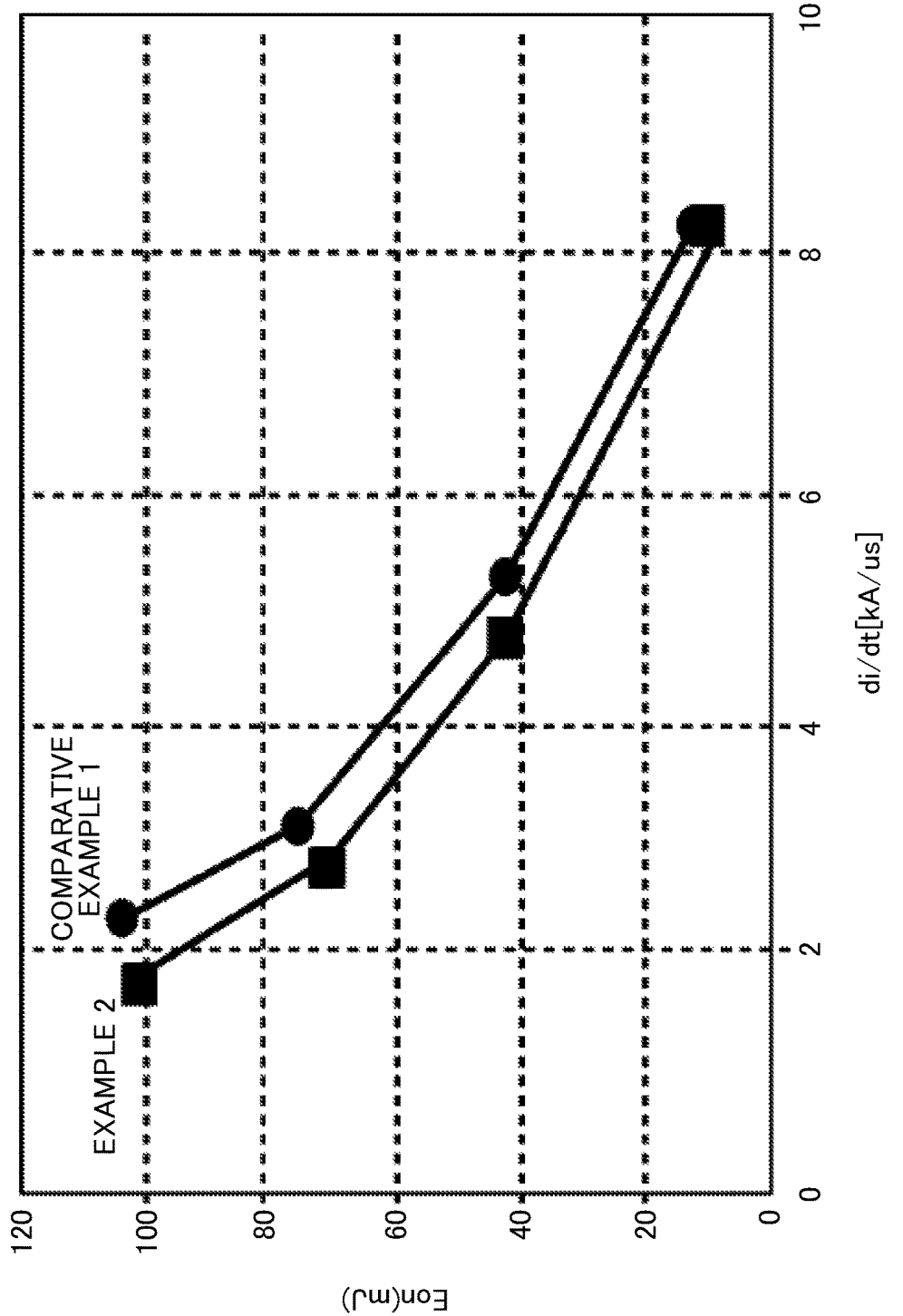
FIG. 9 illustrates the relationship between turn-on loss Eon and turn-on di/dt.

FIG. 9 illustrates the relationship of turn-on loss Eon and turn-on di/dt. The vertical axis shows turn-on loss Eon [mJ] while the horizontal axis shows turn-on di/dt [kA/us]. The curves of the present example shows di/dt-Eon curves according to Example 2 and Comparative Example 1.

Turn-on conditions of the present example are as follows: power source voltage Vcc=700V; collector electric current Ic=400 A/cm$^2$; main circuit inductance Ls=70 nH; and junction temperature Tj=175 degrees C. Also, the results of the present example correspond to the cases in which external gate resistance Rg is varied to 1Ω, 5Ω, 10Ω, 15Ω and 30Ω, respectively. Note that the semiconductor substrate 10 of the present example has resistivity of 70Ω cm and thickness of 110 μm.

The di/dt-Eon curve of Example 1 shows improved properties relative to di/dt-Eon curve according to Comparative Example 1. That is, as long as compared at the same di/dt, turn-on loss Eon of Example 2 is reduced relative to that of Comparative Example 1. In this way, the semiconductor device 100 eliminates imbalance due to gate signals during switching operation, thereby improving turn-on properties.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 15: contact region, 17: well region, 18: drift region, 20: buffer region, 22: collector region, 24: collector electrode, 26: interlayer insulating film, 30: emitter trench section, 32: insulating film, 34: emitter conductive section, 40: gate trench section, 41: opposing section, 42: insulating film, 43: protruding section, 44: gate conductive section, 45: polysilicon layer, 50: gate electrode, 51: gate terminal, 52: emitter electrode, 53: emitter terminal, 54: contact hole, 55: contact hole, 56: contact hole, 70: transistor section, 100: semiconductor device, 500: semiconductor device, 510: semiconductor substrate, 512: emitter region, 514: base region, 515: contact region, 516: accumulating layer, 517: well region, 518: drift region, 520: buffer region, 522: collector region, 524: collector electrode, 526: interlayer insulating film, 530: emitter trench section, 532: insulating film, 534: emitter conductive section, 540: gate trench section, 542: insulating film, 544: gate conductive section, 545: polysilicon layer, 550: gate electrode, 551: gate terminal, 552: emitter electrode, 553: emitter terminal, 554: contact hole, 555: contact hole, 556: contact hole, 570: transistor section

What is claimed is:

1. A semiconductor device comprising:
   a semiconductor substrate;
   a plurality of gate trench sections formed in the semiconductor substrate; and
   a plurality of emitter trench sections formed in the semiconductor substrate, one or more emitter trench sections provided in each region between adjacent gate trench sections of the plurality of gate trench sections,
   wherein the semiconductor device includes at least one of:
   pairs of gate trench sections in which at least two gate trench sections of the plurality of gate trench sections are connected; and a pair of emitter trench sections in which at least two emitter trench sections of the plurality of emitter trench sections are connected.

2. The semiconductor device according to claim 1, wherein the plurality of gate trench sections are formed evenly in an arrangement direction of the plurality of gate trench sections.

3. The semiconductor device according to claim 1, wherein
   the pairs of gate trench sections has a loop-shape structure in which end portions of two gate trench sections of the plurality of gate trench sections are connected to one another;
   the pair of emitter trench sections has a loop-shape structure in which end portions of two emitter trench sections of the plurality of emitter trench sections are connected to one another; and
   the pair of emitter trench sections is formed at an inner side of the loop-shape structure of the pairs of gate trench sections in a planar view.

4. The semiconductor device according to claim 3, further comprising an interlayer insulating film at an inner side of the loop-shape structure of the pair of emitter trench sections to cover a front surface of the semiconductor substrate.

5. The semiconductor device according to claim 3, wherein the pair of emitter trench sections is formed between one pair of the pairs of gate trench sections and another pair of the pairs of gate trench sections.

6. The semiconductor device according to claim 3, further comprising:
- a drift region of a first conductivity type formed in the semiconductor substrate; and
- a base region of a second conductivity type formed below the drift region in the semiconductor substrate,
- wherein the drift region is formed to contact the base region.

7. The semiconductor device according to claim 6, further comprising:
- emitter regions of the first conductivity type on a front surface of the semiconductor substrate, the emitter regions having a higher concentration than the drift region; and
- contact regions of the second conductivity type on the front surface of the semiconductor substrate, the contact regions having a higher concentration than the base region,
- wherein the emitter regions and the contact regions are formed alternately in an extending direction of the gate trench sections and the emitter trench sections between the gate trench section and the emitter trench section adjacent to each other.

8. The semiconductor device according to claim 7, wherein the semiconductor substrate does not have the emitter regions or the contact regions at an inner side of the loop-shape structure of the pair of emitter trench sections.

* * * * *